United States Patent [19]

Collins et al.

[11] 4,133,631

[45] Jan. 9, 1979

[54] PHOTOFLASH LAMP ARRAY CIRCUIT BOARD HAVING RADIATION SENSITIVE FUSE ELEMENTS

[75] Inventors: Edward J. Collins, Mentor on the Lake; Vaughn C. Sterling, Cleveland Heights, both of Ohio

[73] Assignee: General Electric Company, Schenectady, N.Y.

[21] Appl. No.: 799,681

[22] Filed: May 23, 1977

[51] Int. Cl.$^2$ ............................................. F21K 5/02
[52] U.S. Cl. ...................................... 431/359; 362/4; 362/6; 362/13
[58] Field of Search ............... 431/95 R, 95 A; 362/4, 362/6, 11, 13

[56] References Cited

U.S. PATENT DOCUMENTS

| | | | |
|---|---|---|---|
| 3,532,931 | 10/1970 | Cote et al. | 431/95 A |
| 3,894,226 | 7/1975 | Hanson | 362/6 |
| 4,017,728 | 4/1977 | Audesse et al. | 431/95 R |
| 4,049,844 | 9/1977 | Bolon et al. | 431/95 A |

Primary Examiner—Carroll B. Dority, Jr.
Attorney, Agent, or Firm—John F. McDevitt; Lawrence R. Kempton; Frank L. Neuhauser

[57] ABSTRACT

Fuse elements are used with a circuit board to provide more reliable sequential firing in a flash lamp array. The circuit board includes the lamp firing circuitry along with radiation switches connected in said circuitry and the fuse elements cooperate with said radiation switches in the circuit operation. Fuse elements are deposited on the circuit pattern adjacent to the flash lamps for actuation by radiation being emitted therefrom and the activated fuse elements interrupt the circuit path by thermal action. In a preferred embodiment, the circuit board is constructed from an organic polymer and the fuse elements are deposited at circuit locations wherein the underlying substrate has a thickness less than the substrate thickness elsewhere to produce holes in the circuit board by melting or thermal decomposition.

8 Claims, 2 Drawing Figures

PHOTOFLASH LAMP ARRAY CIRCUIT BOARD HAVING RADIATION SENSITIVE FUSE ELEMENTS

BACKGROUND OF THE INVENTION

Various means are known to sequentially fire a photoflash lamp array utilizing a circuit board having the firing circuitry deposited directly thereon. The use of radiation-sensitive switches and fuses connected in said circuitry is also known. A photoflash unit of this general type is described in U.S. Pat. No. 3,894,226, issued July 8, 1975, to James M. Hanson, wherein the particular flash lamps employed provide an open circuit condition between the lead-in wires upon flashing and radiation-sensitive switches permit the next lamp to be flashed. It is also recognized in U.S. Pat. No. 3,532,931, issued Oct. 6, 1970, to P. T. Cote et al, that fuse means are useful when the flash lamps are not reliably non-shorting upon flashing to assure that an open circuit condition will result. By such means, an already fired flash lamp exhibiting relatively low resistance between the current conductors by reason of a shorted condition cannot thereafter absorb part of the electrical energy when the next firing pulse is applied to the next flash lamp and thereby possibly preclude the desired firing sequence from taking place.

SUMMARY OF THE INVENTION

It is a primary object of the present invention to provide fuse elements deposited on a circuit board to enable associated flash lamps to be fired in sequence.

Another important object of the invention is to provide a circuit board of this type having both radiation sensitive switching elements and radiation sensitive fuse elements deposited on the circuit pattern for cooperation therebetween when the associated lamps are flashed.

A still further object of the present invention is to provide fuse means which interrupts the circuit path by thermally melting or decomposing the underlying substrate to create a hole or opening for permanent disruption of the electrical connection.

SUMMARY OF THE INVENTION

These and other objects of the present invention are achieved with a lamp firing circuit pattern which includes radiation sensitive switches when radiation sensitive fuse elements are deposited on said circuit pattern to physically interrupt the circuit path upon activation. Fuse elements operating in the desired manner can be obtained by simply depositing a mass of adherent radiation absorbing material on the circuit pattern itself at a location sufficiently proximate to the associated flash lamp so as to be actuated by the emitted radiation for permanent disruption of the electrical connection to the actuating flash lamp. Suitable radiation sensitive switches providing the desired cooperation of sequential lamp firing are described in U.S. Pat. No. 3,990,833, issued Nov. 9, 1976, to Fred F. Holub et al, and also assigned to the assignee of the present invention so as not to require repeated description in the present application. Generally, said switches are also deposited on the circuit pattern for actuation by radiation being emitted from adjacent flash lamps to provide a circuit path to the next flash lamp to be fired by undergoing conversion from a high electrical resistance to a low resistance state.

For satisfactory operation in a photoflash unit of this type utilizing radiation sensitive switches as disclosed in the above referenced U.S. Pat. No. 3,990,833, it is required that the fuse elements exhibit a relatively low electrical resistance up to approximately 1,000 ohms before actuation but exhibit an electrical resistance across the interrupted circuit path after actuation of at least $10^8$ ohms. Understandably, the heat absorption capability of the fuse element is an additional consideration and such radiation absorbent particulate solids as carbon, copper oxide, and stannous oxide provide both essential requirements. A simple suspension of the radiation absorbent material in an organic polymer binder can be deposited on the circuit pattern with the desired operating characteristics being further dependent on cross-sectional geometry, color, and thermal properties that can be still further modified with fillers all in a known manner.

DESCRIPTION OF THE PREFERRED EMBODIMENTS

Figure 1:
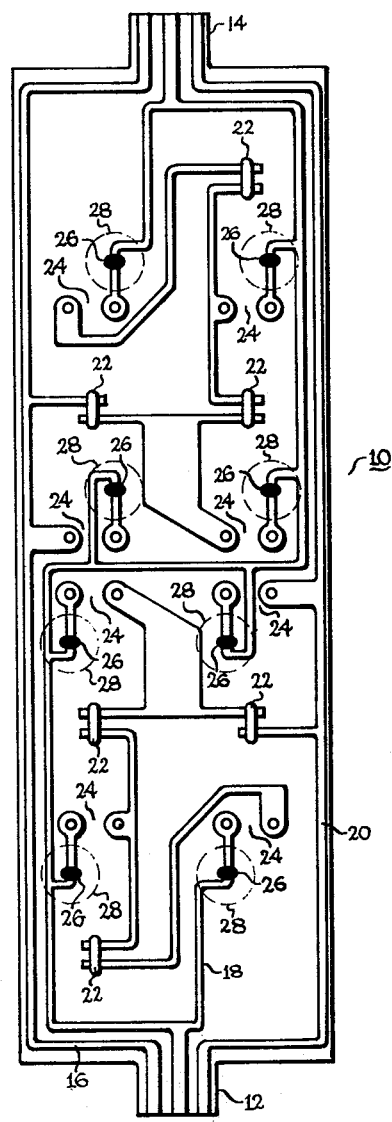
FIG. 1 is an illustration of an otherwise known multiple flash lamp circuit board having a lamp firing circuit pattern deposited on a dielectric substrate and radiation sensitive switching devices connected in said circuitry for sequential firing of a plurality of flash lamps connected thereto which has been modified in accordance with the present invention.

In the preferred circuit board embodiment depicted in FIG. 1, both radiation sensitive switches and radiation sensitive fuse elements are deposited on the circuit pattern adjacent flash lamp locations for simultaneous actuation of each adjoining switch and fuse element by radiation being emitted from an adjacent flash lamp. Accordingly, the circuit arrangement of FIG. 1 is generally the same as disclosed in the above referenced U.S. patents which includes a circuit board member 10, in the form of a dielectric substrate constructed with an organic polymer, having connector tabs 12 and 14 located at each end for insertion of said circuit board member to an associated camera socket (not shown). The camera socket has contacts for conductor lines 16, 18 and 20 of the lamp firing circuit pattern to connect four flash lamps in parallel between conductor lines 16 and 18 when connector tab 12 has been inserted in the camera socket. Correspondingly, a second group of four lamps is connected between conductor lines 18 and 20 when connector tab 14 has been inserted into the camera socket. Thus while an entire illustrative circuit board is shown, there is need to discuss only a single group of four flash lamps since the operation of the second group of four flash lamps is essentially the mirror image of the first group. Conductor lines 16 and 20 are interrupted by radiation switches 22 to prevent the flash lamps in a group from all being fired together on release of the camera shutter. As can be noted, the switches 22 are each arranged in a region of a flash lamp termination 24 so that the heat and light released when the flash lamp is fired operates to convert the respective switch from a non-conductive to an electrically-conductive state, thus establishing current path to the next lamp to be flashed. Accordingly, when the particular flash lamp in the circuit is flashed, then the adjacent radiation switch is actuated providing a current path to the next lamp to be flashed. Each of the radiation switches are in contact and bridge across the conductor lines of the electrical circuit with material employed in the radiation switch initially having an open circuit or high resistance condition and with said resistance thereafter becoming zero or a low value when the material receives radiation and/or heat from an adjacent flash lamp upon firing of said lamp. It can also be noted that conductor line 18 has deposited thereon fuse elements 26 at locations proximate to the flash lamp terminations 24 so as to also be actuated by the heat and light released when the flash lamp is fired. Circular shaped indentations 28 (shown in phantom) surrounding each of said fuse elements 26 have been formed on the opposite side of the circuit board member to provide a lesser thickness than exists elsewhere on the circuit board and thereby assist interruption of the circuit path from conductor 18 to the already fired flash lamp. When the particular flash lamp adjacent to a given fuse element is flashed, the radiation and/or heat created thereby is absorbed by said fuse element causing the underlying substrate of the conductor pattern as well as the circuit board to either thermally melt or decompose and create a hole or opening which permanently disrupts the electrical connection to the already fired flash lamp.

Figure 2:
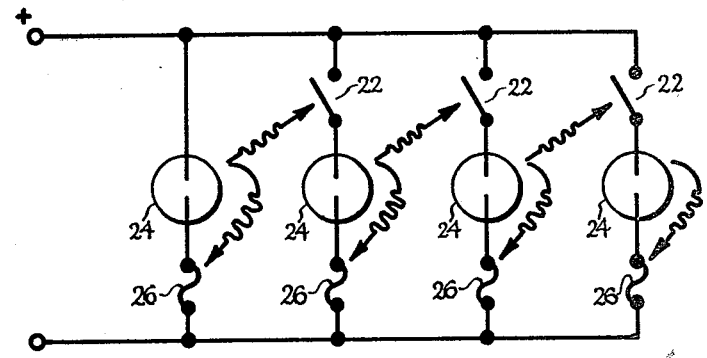
FIG. 2 is an electrical schematic diagram illustrating the circuit path for one group of four flash lamps being sequentially fired by the circuit board configuration in FIG. 1.

A more detailed description of the sequential firing operation for the circuitry of a four-lamp group in the above described circuit board can be provided in connection with the schematic diagram shown in FIG. 2. Accordingly, in FIG. 2 there is shown the flash lamps 24 electrically connected in branch circuits to assure that the branch circuit of each lamp will become an open circuit upon the flashing of the lamp in that circuit. The desired mode of operation is carried out starting with the leftmost branch circuit when the lamp in said circuit is flashed and causes fuse element 26 in the same branch circuit to physically interrupt the circuit path to said lamp while simultaneously opening the circuit path to the flash lamp in an adjacent branch circuit by actuating radiation sensitive switch 22 in that branch circuit to the conductive state. This cooperative action is repeated between successive adjacent branches until all four lamps in the group have been fired from simultaneous actuation of adjoining switch and fuse elements with radiation being emitted from an adjacent flash lamp.

As previously indicated, a fuse element for operation as above described can simply comprise a mass of radiation absorbent material adhesively bonded to the circuit pattern. This can be accomplished with a physical mixture of radiation absorbent particulate solids with an organic polymer binder and which can be adhered directly to the dielectric substrate. A satisfactory fuse material composition contains at least 20 percent or more of the radiation absorbent particulate solids such as carbon black mixed with a conventional liquid adhesive which hardens to a solid at ordinary temperatures. When this fuse material composition is deposited directly on the circuit pattern and allowed to harden at the locations on the circuit board that have been recessed to enhance localized melting or decomposition of the underlying substrate, the fuse actuation produces a hole through the entire composite medium. Interruption of the circuit path in this manner can also be facilitated if the conductor lines in the branch circuits for each associated flash lamp are kept to a minimum width or thickness.

While preferred embodiments of the invention have been shown and described, various other embodiments and modifications thereof will become apparent to persons skilled in the art. For example, the desired circuit interruption can also be achieved by having the fuse elements deposited in physical contact with and bridging across spaced apart terminals of the circuit pattern. It is therefore intended to limit the present invention only by the scope of the following claims.

What we claim as new and desire to secure by Letters Patent of the United States is:

1. In a circuit board for a photoflash lamp array having a lamp firing circuit pattern deposited on a dielectric substrate and radiation sensitive switches connected in said circuitry for sequential firing of a plurality of flash lamps connected thereto, the improvement wherein radiation sensitive fuse elements are deposited on said circuit pattern adjacent the associated lamps to physically interrupt the circuit path below upon activation and in a manner which is accompanied by the thermal destruction of the underlying dielectric substrate.

2. A circuit board as in claim 1 wherein the fuse elements comprise a mass of radiation absorbent material adhesively bonded to the circuit pattern.

3. A circuit board as in claim 2 wherein the fuse elements comprise a mixture of radiation absorbent particulate solids with an organic polymer binder.

4. A circuit board as in claim 1 wherein the dielectric substrate is an organic polymer and the fuse elements are deposited at circuit board locations wherein said dielectric substrate has a thickness less than the substrate thickness elsewhere.

5. In a circuit board for a photoflash lamp array having a lamp firing circuit pattern deposited on a dielectric substrate for sequential firing of a plurality of flash lamps connected thereto, the improvement wherein radiation sensitive switches and radiation sensitive fuse elements are deposited on said circuit pattern adjacent said flash lamps for simultaneous activation of each adjoining switch and fuse element by radiation being emitted from the adjacent flash lamp so that the activated switch provides a circuit path to the next flash lamp to be fired while the activated fuse element interrupts the circuit path below to the flash lamp providing said radiation and in a manner which is accompanied by thermal destruction of the underlying dielectric substrate.

6. A circuit board as in claim 5 wherein the fuse elements comprise a mass of radiation absorbent material adhesively bonded to the circuit pattern.

7. A circuit board as in claim 5 wherein the fuse elements comprise a mixture of radiation absorbent particulate solids with an organic polymer binder.

8. A circuit board as in claim 5 wherein the dielectric substrate is an organic polymer and the fuse elements are deposited at circuit board locations wherein said dielectric substrate has a thickness less than the substrate thickness elsewhere.

* * * * *